US007968364B2

(12) United States Patent
Schirmer et al.

(10) Patent No.: US 7,968,364 B2
(45) Date of Patent: Jun. 28, 2011

(54) MEMS SWITCH CAPPING AND PASSIVATION METHOD

(75) Inventors: Mark Schirmer, Stoughton, MA (US); John Dixon, Van Nuys, CA (US); Raymond Goggin, Watergrasshill (IE); Padraig Fitzgerald, Mallow (IE); David Rohan, County Limerick (IE); Jo-ey Wong, Wayland, MA (US)

(73) Assignee: Analog Devices, Inc., Norwood, MA (US)

( * ) Notice: Subject to any disclaimer, the term of this patent is extended or adjusted under 35 U.S.C. 154(b) by 121 days.

(21) Appl. No.: 12/544,470

(22) Filed: Aug. 20, 2009

(65) Prior Publication Data

US 2010/0068854 A1 Mar. 18, 2010

Related U.S. Application Data

(63) Continuation-in-part of application No. 11/538,251, filed on Oct. 3, 2006, now abandoned.

(60) Provisional application No. 60/723,019, filed on Oct. 3, 2005.

(51) Int. Cl.
*H01L 21/00* (2006.01)

(52) U.S. Cl. .......................................... 438/51; 438/52

(58) Field of Classification Search .................... 438/51, 438/52

See application file for complete search history.

(56) References Cited

U.S. PATENT DOCUMENTS 2,664,618 A 1/1954 Kleis ............................ 29/182.5
4,674,180 A 6/1987 Zavracky et al. ............... 29/622
4,764,244 A 8/1988 Chitty et al. .................. 156/630
4,959,515 A 9/1990 Zavracky et al. ............. 200/181
5,635,750 A 6/1997 Schlaak et al. ................ 257/414
5,638,946 A 6/1997 Zavracky ...................... 200/181
6,091,125 A 7/2000 Zavracky ...................... 257/417
6,153,839 A 11/2000 Zavracky et al. ............. 200/181
6,191,671 B1 2/2001 Schlaak et al. .................. 335/78
6,483,395 B2 11/2002 Kasai et al. ................... 333/105
6,963,117 B2 * 11/2005 Yang et al. .................... 257/415
7,173,203 B2 2/2007 Ma ............................... 200/181

(Continued)

FOREIGN PATENT DOCUMENTS

EP 1 628 138 A2 2/2006

(Continued)

OTHER PUBLICATIONS

Authorized Officers Aikaterini Drakonaki and Günther Socher, Notification of Transmittal of the International Search Report and the Written Opinion of the International Searching Authority, or the Declaration; PCT/US2010/044254, Nov. 9, 2010.

(Continued)

*Primary Examiner* — Thanh V Pham
*Assistant Examiner* — Caleb Henry
(74) *Attorney, Agent, or Firm* — Sunstein Kann Murphy & Timbers LLP

(57) ABSTRACT

A MEMS switch with a platinum-series contact is capped through a process that also passivates the contact by controlling, over time, the amount of oxygen in the environment, pressures and temperatures. Some embodiments passivate a contact in an oxygenated atmosphere at a first temperature and pressure, before hermetically sealing the cap at a higher temperature and pressure. Some embodiments hermetically seal the cap at a temperature below which passivating dioxides will form, thus trapping oxygen within the volume defined by the cap, and later passivate the contact with the trapped oxygen at a higher temperature.

12 Claims, 9 Drawing Sheets

U.S. PATENT DOCUMENTS

| | | | | |
|---|---|---|---|---|
| 7,202,764 | B2 | 4/2007 | Deligianni et al. | 335/78 |
| 7,256,669 | B2 | 8/2007 | Morrison, Jr. et al. | 335/78 |
| 7,372,191 | B2 | 5/2008 | Ohmori et al. | 310/330 |
| 2002/0088112 | A1 | 7/2002 | Morrison, Jr. et al. | 29/622 |
| 2005/0007217 | A1 | 1/2005 | Deligianni et al. | 335/78 |
| 2005/0062120 | A1 * | 3/2005 | Ma et al. | 257/414 |
| 2006/0037398 | A1 | 2/2006 | Rich | 73/514.34 |
| 2007/0065295 | A1 | 3/2007 | Moraja et al. | 417/48 |
| 2008/0135386 | A1 | 6/2008 | Bozler et al. | 200/181 |

FOREIGN PATENT DOCUMENTS

| | | |
|---|---|---|
| GB | 645681 | 11/1950 |
| WO | WO 2005/006372 | 1/2005 |

OTHER PUBLICATIONS

T. Yokokawa et al., "*Thickness of Ruthenium Oxide Film Produced by the Surface Deactivation Treatment of Ruthenium-Plated Contact Reed Switches*," Proc. Of the 35$^{th}$ Relay Conf., pp. 177-181, 1987.

Satya P. Sharma et al., "*Oxidation of Ruthenium*," IEEE Transactions on Components, Hybrids, and Manufacturing Technology, vol. CHMT-6, No. 1, pp. 89-92, Mar. 1983.

S.P. Sharma et al., "*Environmental Interactions of Ruthenium*," Proc. 11$^{th}$ Int. Conf. Electrical Contact Phenomena, pp. 290-293, Jun. 7-11, 1982.

R. G. Vadimsky et al., "*Ru and $RuO_2$ as Electrical Contact Materials: Preparation and Environmental Interactions*," J. Electrochem. Soc.: Solid-State Science and Technology, vol. 126, No. 11, Nov. 1979.

Paul C. Hydes, "*Electrodeposited Ruthenium as an Electrical Contact Material: A Review of its Properties and Economic Advantages*," Ullmann's Encyklopadie on Platinum, vol. 18, pp. 50-55, 1979.

J.Y. Shen et al., "*An ESCA Study of the Interaction of Oxygen with the Surface of Ruthenium*," Applied Surface Science, vol. 51, pp. 47-60, 1991.

J. Kristóf et al., "*Investigation on the Formation of $RuO_2$ Film Electrode by Secondary Ion Mass Spectrometry*," Surface Science vol. 348, pp. 287-298, 1996.

Hiroaki Samata et al., "*Crystal Growth and Properties of New Ruthenium Oxides*," J. Phys. Chem. Solids, vol. 59, No. 9, pp. 1445-1452, 1998.

Eung-Jik Lee et al., "*Reactive Ion Etching Mechanism of $RuO_2$ Thin Films in Oxygen Plasma with the Addition of $CF_4$, $Cl_2$, and $N_2$*," Japanese Journal of Applied Physics, vol. 37, Pt. 1, No. 5A, pp. 2634-2641, May 1998.

Authorized Officer Luc Findeli, *International Search Report and Written Opinion of the International Searching Authority*, International Searching Authority, International Application No. PCT/US2006/038313, Jan. 15, 2007, 7 pages.

Authorized Officer Luc Findeli, *International Preliminary Report on Patentability* and *Written Opinion of the International Searching Authority*, PCT/US2006/038313, Apr. 8, 2008, 4 pages.

* cited by examiner

MEMS SWITCH CAPPING AND PASSIVATION METHOD

PRIORITY

This patent application is a continuation-in-part of U.S. patent application Ser. No. 11/538,251, filed Oct. 3, 2006 entitled "MEMS Switch Contact System" and naming Mark Schirmer and John Dixon as inventors (practitioner's file 2550/B31), which claims priority from provisional U.S. patent application No. 60/723,019, filed Oct. 3, 2005 entitled, "MEMS CONTACT SYSTEM USING Pt SERIES METALS AND SURFACE PREPARATION THEREOF," and naming Mark Schirmer as the sole inventor (practitioner's file 2550/A81), the disclosures of which are incorporated herein, in their entirety, by reference.

TECHNICAL FIELD

The invention generally relates to MEMS switches and, more particularly, the invention relates to contact systems for MEMS switches.

BACKGROUND ART

A wide variety of electrical switches operate by moving one member into direct contact with another member. For example, a relay switch may have a conductive cantilever arm that, when actuated, moves to directly contact a stationary conductive element. This direct contact closes an electrical circuit, consequently electrically communicating the arm with the stationary element to complete an ohmic connection. Accordingly, the physical portions of the arm that directly contact each other are known in the art as "ohmic contacts," or as referred to herein, simply "contacts."

Contacts often are fabricated by forming an electrically conductive metal on another surface, which may or may not be an insulator. For example, a cantilevered arm may be formed from silicon, while the contact at its end is formed from a conductive metal. When exposed to oxygen, water vapor, and environmental contaminants, however, the metal may react to form an insulative surface contamination layer, such as an insulative nitride layer, insulative organic layer, and/or an insulative oxide layer. As a result, the contact may be less conductive. Larger switches nevertheless generally are not significantly affected by this phenomenon because they often are actuated with a force sufficient to "break or scrub through" the surface contamination layer (e.g., an insulative oxide layer).

Conversely, switches with much smaller actuation forces often are not able to break through this surface contamination layer. For example, electrostatically actuated MEMS switches often have typical contact forces measured in Micronewtons, which can be on the order of 1000 to 10,000 times less than the comparable force used in larger switches, such as reed or electromagnetic relays. Accordingly, the insulative surface contamination layer may degrade conductivity, which, in addition to reducing its effectiveness, reduces the lifetime of the switch.

SUMMARY OF THE INVENTION

In accordance with one embodiment of the invention, a method of fabricating a hermetically capped MEMS switch that includes a substrate and a platinum-series contact seals a cap to the substrate over the contact in an oxygenated environment in a process that also passivates the contact. In one embodiment, the contact is oxidized at a first temperature and pressure, and the cap is hermetically sealed at a second, higher temperature and pressure. In another embodiment, the cap is hermetically at a temperature below that at which a passivating dioxide will form, and the contact is later oxides at a higher temperature, consuming oxygen confined within the volume defined by the sealed cap. In a preferred embodiment, the contact is ruthenium and the passivation includes ruthenium dioxide.

The platinum-series based material may include a platinum-series element. Alternatively, the platinum-series based material may be a platinum-series based oxide. In some embodiments, at least one of the contacts has both a platinum-series based element and a conductive passivation. For example, the platinum-series based element may be ruthenium, while the conductive passivation may be ruthenium dioxide.

In accordance with another embodiment of the invention, a capped MEMS apparatus has a substrate, a first contact, and a movable member with a second contact that moves relative to the substrate. The substrate supports the movable member. Moreover, at least one of the contacts has a conductive platinum-series based material that provides an electrical connection when contacting the other electrical contact.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DETAILED DESCRIPTION OF SPECIFIC EMBODIMENTS

In illustrative embodiments, a MEMS switch has a contact formed from a platinum-series based material. For example, the contact may be formed from ruthenium metal (hereinafter "ruthenium" alone), ruthenium dioxide, or both. This type of contact should have material properties that provide favorable resistances and durability, while at the same time minimizing undesirable insulative surface contamination layers that could degrade switch performance. The MEMS switch is capped in a process that employs oxygen, such that the passivation of the switch contact and the capping occur via a continuous process in an oxygen-controlled environment. Details of illustrative embodiments are discussed below.

Figure 1:
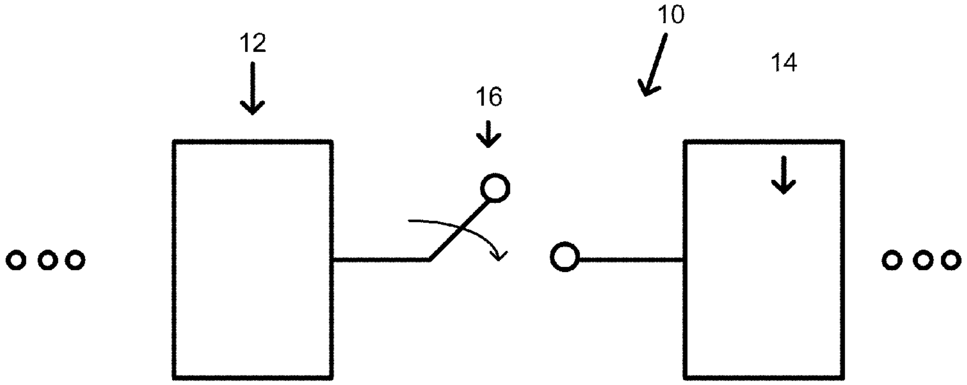
FIG. 1 schematically shows an electronic system a switch that may be configured in accordance with illustrative embodiments of the invention.

FIG. 1 schematically shows an electronic system 10 using a switch that may be implemented in accordance with illustrative embodiments of the invention. In short, the electronic system 10 has a first set of components 12 represented by a block of the left side of the figure, the second set of components 14 represented by a block on the right side of the figure, and a switch 16 that alternatively connects the first and second sets of components 12 and 14. In illustrative embodiments, the switch 16 is a microelectromechanical system, often referred to in the art as a "MEMS device." Among other things, the system 10 shown in FIG. 1 may be a part of a RF switching system within a cellular telephone.

As known by those skilled in the art, when closed, the switch 16 electrically connects the first set of components 12 with the second set of components 14. Accordingly, when in this state, the system 10 may transmit electronic signals between the first and second sets of components 12 and 14. Conversely, when the switch 16 is opened, the two sets of components 12 and 14 are not electrically connected and thus, cannot electrically communicate through this path.

Figure 2A:
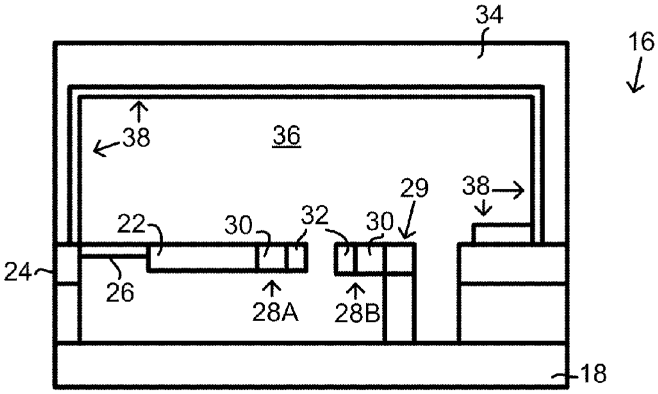
FIG. 2A schematically shows a cross-sectional view of a MEMS switch configured in accordance with one embodiment of the invention.

FIG. 2A schematically shows a cross-sectional view of a MEMS switch 16 configured in accordance with illustrative embodiments of the invention. In this embodiment, the MEMS switch 16 is formed as an integrated circuit packaged at the wafer level. Specifically, the switch 16 has a substrate 18 supporting and suspending movable structure that alternatively opens and closes a circuit. To that end, the movable structure includes a movable member 22 movably connected to a stationary member 24 by means of a flexible spring 26.

The stationary member 24 illustratively is fixedly secured to the substrate 18 and, in some embodiments, serves as an actuation electrode to move the movable member 22, when necessary. Alternatively, or in addition, the switch 16 may have one or more other actuation electrodes not shown in the figures. It should be noted, however, that electrostatically actuated switches are but one embodiment. Various embodiments apply to switches using other actuation means, such as thermal actuators and electromagnetic actuators. Discussion of electrostatic actuation therefore is not intended to limit all embodiments.

The movable member 22 has an electrical contact 28A at its free end for alternately connecting with a corresponding contact 28B on a stationary contact beam 29. When actuated, the movable member 22 translates in a direction generally parallel to the substrate 18 to contact the contact 28B on the stationary contact beam 29. During use, the movable member 22 alternatively opens and closes its electrical connection with the stationary contact beam 29. When closed, the switch 16 creates a closed circuit that typically forms a communication path between various elements, such as those discussed above.

The die forming the electronic switch 16 can have a number of other components. For example, the die could also have circuitry (not shown) that controls a number of functions, such as actuation of the movable member 22. Accordingly, discussion of the switch 16 without circuitry is for convenience only.

It should be noted that various embodiments can use a wide variety of different types of switches. For example, the switch 16 could multiplex more than two nodes and thus, be a three or greater position switch. Those skilled in the art should be capable of applying principles of illustrative embodiments to a wide variety of different switches. Discussion of the specific switch 16 in FIGS. 2A and 2B, as well as the switch 16 in FIGS. 3A and 3B, thus are illustrative and not intended to limit a number of different embodiments.

In accordance illustrative embodiments of the invention, one or both of the two noted contacts 28A and/or 28B is formed from a platinum-series based material (also known as "platinum group" or "platinum metals"). Specifically, as known by those skilled in the art, platinum-series elements include platinum (Pt), ruthenium (Ru), rhodium (Rh), palladium (Pd), osmium (Os), and iridium (Ir). Contacts 28A or 28B having platinum-series based materials therefore comprise at least a platinum-series based element. For example, ruthenium dioxide ($RuO_2$, or RuO2) is considered to be a platinum-series based material because part of it is ruthenium.

In one embodiment, one contact (e.g., contact 28A) is formed from a platinum-series based material, while the other contact (e.g., contact 28B) is formed from another type of material, such as a gold based material. In preferred embodiments, however, both contacts 28A and 28B are formed from a platinum-series based material. In some embodiments, this material simply may be a conductive oxide, such as ruthenium dioxide. In other embodiments, however, one or both of the contacts 28A and 28B have at least two layers; namely, a base layer 30 and a conductive passivation layer 32 (also referred to simply as "passivation layer 32" or more generally as "conductive passivation"). For example, the base layer 30 may be a platinum-series element, such as ruthenium, while the passivation layer 32 is a conductive oxide. Among others, the conductive oxide may be a platinum-series based material, such as ruthenium dioxide. In other embodiments using this two layer approach, however, the conductive oxide is not a platinum-series based material. Moreover, this two layer approach can have additional layers, such as an adhesion layer between the two layers 30 and 32.

Platinum-series based elements provide a number of advantages when used to form contacts 28A and/or 28B. Specifically, in the MEMS context, thin layers of such materials (e.g., on the order of angstroms) provided a relatively low resistivity while being hard enough to withstand repeated contact. During experiments, however, contacts formed from platinum-series elements alone undesirably formed an insulative surface contamination layer. It subsequently was discovered that application of an appropriate conductive oxide both passivated the base layer 30 and substantially mitigated formation of an insulative surface contamination layer. Moreover, the conductive oxide permitted sufficient conductivity. It also was discovered that rather than using a two layer approach, a single conductive oxide comprised of a platinum-series based material also provided satisfactory results. Consequently, when applied as discussed herein, certain materials, such as platinum-series based materials, can be used to form the contacts 28A and/or 28B without the significant risk of formation of an insulative surface contamination layer.

As noted above, the switch 16 in FIG. 2A is packaged at the wafer level. To that end, the switch 16 also has a cap 34 for protecting the sensitive internal microstructure. In illustrative embodiments, the cap 34 forms a hermetically sealed chamber 36 that protects the internal components of the switch 16.

It is anticipated that the conductive passivation layer 32 may deteriorate or degrade to some extent during the lifetime of the switch 16, or have some kind of imperfection that adversely affects its passivation capabilities. For example, although it serves its purpose as a satisfactory passivation element, the discussed conductive oxide still may have some permeability to oxygen remaining in the chamber 36 from fabrication processes. Specifically, semiconductor packaging processes often seal the chamber 36 in the presence of oxygen. In one such process, glass frit wafer-to-wafer bonding processes may require bonding in the presence of oxygen to facilitate organic burn off of volatile solvents in the glass paste. In addition, if the glass contains lead, oxygen may be required to oxidize any metallic lead to prevent subsequent surface contamination.

As noted above, exposure to these contaminants in some circumstances can cause formation of an insulative surface contamination layer. For example, when at least one of the contacts 28A or 28B is formed from ruthenium, sufficient exposure to oxygen may cause formation of an insulative oxide layer, such as a ruthenium oxide (RuO) layer, or a ruthenium tetraoxide ($RuO_4$, or RuO4) layer.

Accordingly, to further protect the contacts 28A and 28B, illustrative embodiments provide a gettering system 38 for attracting and trapping much of the residual contaminants, such as oxygen, if any, within the hermetically sealed chamber 36. For example, among other ways of gettering, the switch 16 may have a coating of deposited platinum-series metal, such as ruthenium, innocuously located within the chamber 36. To that end, FIG. 2A shows ruthenium coated on portions of the interior facing surface of the cap 34, and on innocuous, inactive, "white" areas of the die surface. To provide maximum efficiency, the exposed gettering material preferably has a surface area that is substantially greater than the surface area of the contacts 28A and 28B. For example, the contacts 28A and 28B may have a total area of 3-12 microns squared, while the area of the gettering material could have an area of 500-1000 microns squared. Although not optimal, some embodiments do not passivate the contact 28A and/or 28B (e.g., with a conductive oxide if the contact 28A and/or 28B is a metal, such as ruthenium) and simply use the gettering system 38. It should be noted that the gettering system 38 can be formed to attract contaminants other than oxygen. Accordingly, discussion of an oxygen gettering system is illustrative.

Figure 2B:
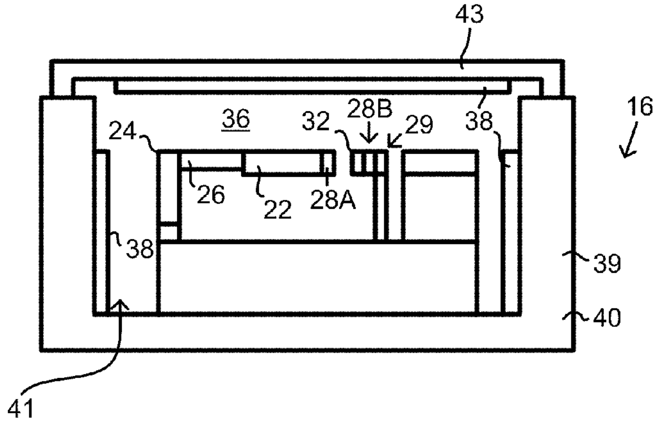
FIG. 2B schematically shows a cross-sectional view of a MEMS switch configured in accordance with another embodiment of the invention.

FIG. 2B schematically shows a cross-sectional view of another embodiment of the invention. One primary difference between this embodiment and the switch 16 shown in FIG. 2A is its packaging design. Specifically, unlike the switch 16 shown in FIG. 2A, the switch 16 in this embodiment is packaged in a conventional cavity package 38 that contains the entire switch die. To that end, the package has a base 39 forming a cavity 41, and a lid 43 that hermetically seals the cavity 41 to form the package chamber 36 noted above. As an example, the cavity package 38 could be a conventional ceramic cavity package commonly used in the semiconductor industry. In a manner similar to the switch 16 shown in FIG. 2A, this switch 16 also has a gettering system 38 within its interior. To that end, the chamber 36 may have several gettering sites, such as on the interior facing surface of the lid 43, along the sidewalls of the base 39, and on the die itself. Of course, the gettering sites could be in other locations within the interior chamber 36. Accordingly, discussion of specific locations of the gettering sites is illustrative and not intended to limit various embodiments of the invention.

The switch 16 can be packaged in a number of other types of packages. Discussion of the two types in FIGS. 2A and 2B therefore is illustrative only.

Another difference between the switch 16 in FIG. 2A and this switch 16 is the makeup of one of its contact 28A. Specifically, the contact 28A on the movable member 22 is the single layer type discussed above (i.e., no passivation layer 32). For example, this single layer contact 28A may be formed from a platinum-series based conductive oxide, such as ruthenium dioxide.

Figure 3A:
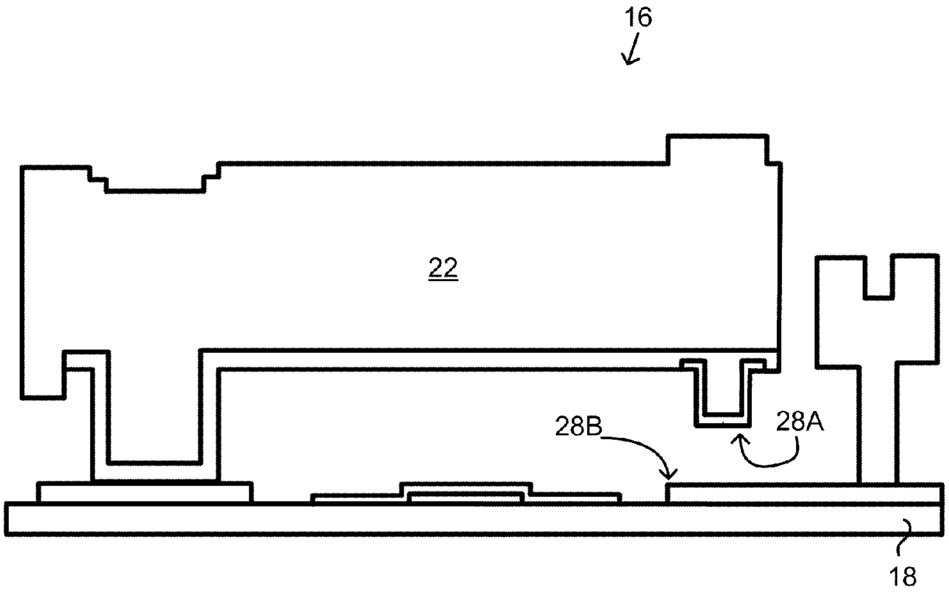
FIG. 3A schematically shows a cross-sectional view of a MEMS switch configured in accordance with yet another embodiment of the invention.
Figure 3B:
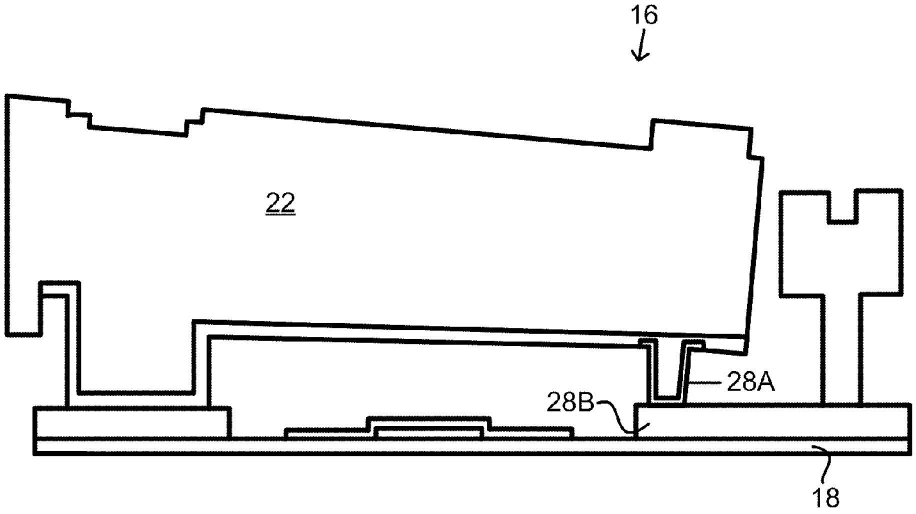
FIG. 3B schematically shows a cross-sectional view of the MEMS switch of FIG. 3A in an actuated position.

Of course, as noted above, various embodiments apply to many different types of switches. For example, rather than apply to switches having one stationary contact 28B and another moving contact 28A, various embodiments apply to switches having two or more moving contacts. FIGS. 3A and 3B show yet another example of a switch 16 that may implement illustrative embodiments in the invention. FIG. 3A shows the switch 16 in an open circuit position (i.e., not actuated), while FIG. 3B shows the same switch 16 in a closed position (i.e., in an actuated position, which closes the circuit). For simplicity, reference numbers of components in this embodiment are the same as those of like components in other embodiments.

Rather than having a member that moves only in the plane parallel to the substrate 18, the movable member 22 in this embodiment moves generally perpendicular to the substrate 18, or in an arcuate manner relative to the substrate 18. Such a design often is referred to as a "cantilevered design." The stationary contact 28B of this embodiment therefore simply is generally planar and positioned on the surface of the substrate 18. The contacts 28A and 28B may be comprised of the same materials as discussed above (although schematically shown as appearing to have only one layer—they still may have two layers, which is similar to other embodiments). In a similar manner, this embodiment has other similar components, such as a movable member 22, stationary member 24, and substrate 18. In a manner similar to other embodiments, this embodiment may be contained in a conventional package, such as one of the packages shown in FIG. 2A or 2B, with or without gettering.

Figure 4:
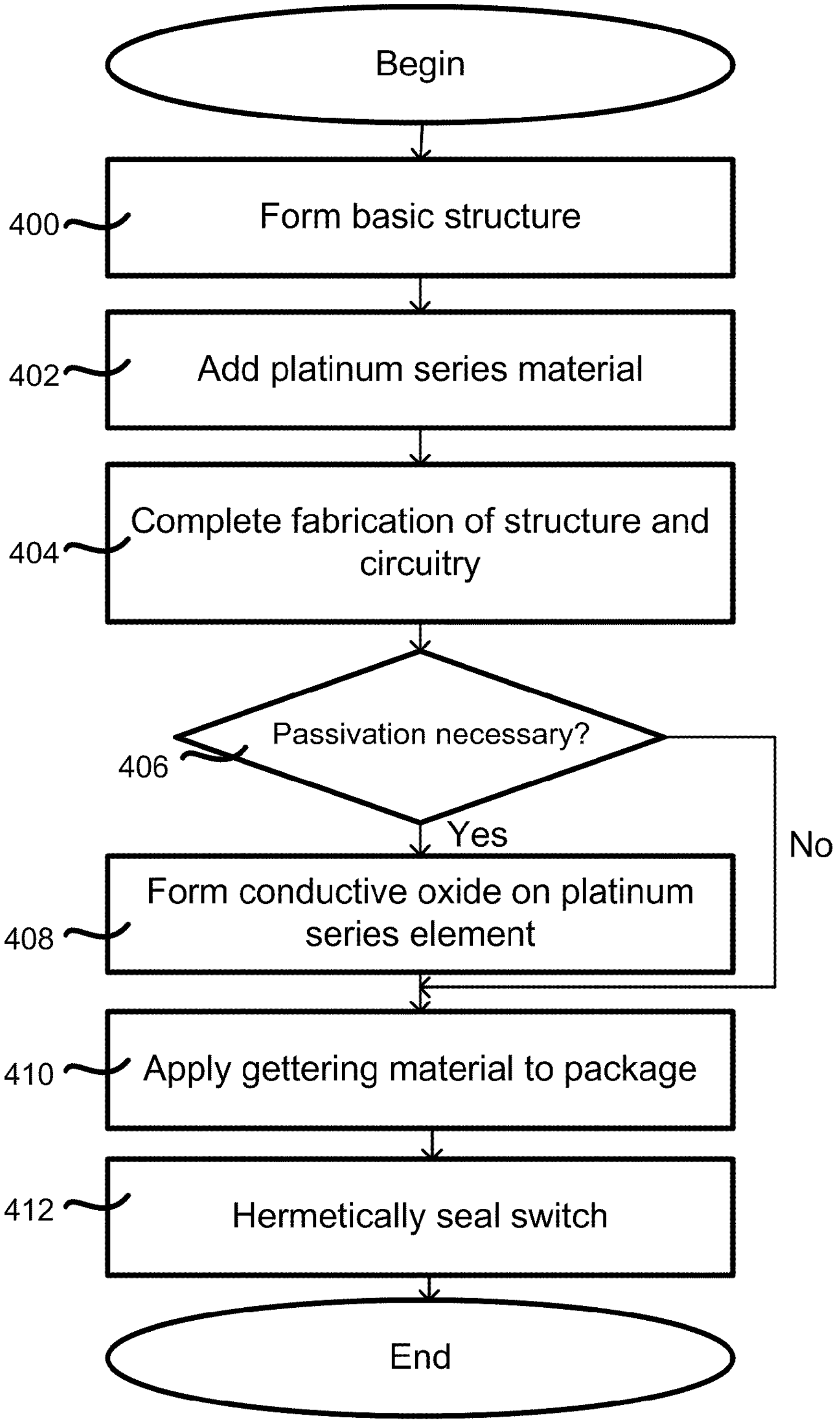
FIG. 4 shows a process of forming a MEMS switch in accordance with illustrative embodiments of the invention.

FIG. 4 shows one process of forming a switch in accordance with illustrative embodiments of invention. This switch 16 may be one of those shown in the previous figures, or one having a different configuration. Because it fabricates a MEMS device, the process may use the conventional micromachining technology similar to that commonly used by Analog Devices, Inc., of Norwood, Mass.

It should be noted that for simplicity, the process of FIG. 4 is discussed as forming a single MEMS device. Those skilled in the art should understand, however, that this process can be applied to batch fabrication processes forming a plurality of MEMS devices on a single base wafer. Moreover, the steps of this process are illustrative and do not necessarily disclose each and every step that should or could be used in a MEMS fabrication process. In fact, some of the steps may be performed in a different order. Accordingly, discussion of the process of FIG. 4 is not intended to limit all embodiments of the invention.

The process begins at step 400, which forms the base structure. For example, the process may begin by depositing and etching various layers of materials on a base substrate. The movable member 22 may or may not be formed at this point. For example, the process may fabricate the movable member 22 and expose its end for depositing contact material in a subsequent step. Alternatively, the process may form a recess or specific area on a sacrificial layer for first depositing contact material in a subsequent step, and then depositing material (on the contact material) that forms the movable member 22 in an even later step.

Accordingly, step 402 then deposits the contact materials; namely, the process deposits platinum-series based material on at least the location designated step 400, and on a location that will form the stationary contact 28B. In illustrative embodiments, the process may deposit ruthenium metal through conventional means, such as with a sputtering or plating mechanism. After it is deposited, conventional wet or dry etch processes pattern the deposited material to ensure that the ruthenium is at the correct contact locations. Alternatively, as noted above, rather than deposit ruthenium metal, this step may deposit and pattern a conductive oxide, such as ruthenium dioxide, in a conventional manner to the relevant location.

The process then continues to step 404, which completes fabrication of the structure and circuitry on the switch die. As noted above, this step may employ conventional surface micromachining technologies, such as plating, deposition, patterning, etching, and release operations. For example, this step may deposit sacrificial oxides and conductive layers to form the movable member 22 and other components, and then release the movable member 22 and other suspended components (if any). In illustrative embodiments, the movable member 22 is primarily formed from gold or a gold alloy.

It then is determined at step 406 if the contacts 28A and/or 28B should be passivated (i.e., protected from the environment of the package chamber 36, which, as noted above, could have residual oxygen or other contaminants). If step 402 deposited a platinum-series metal, such as ruthenium, then the contact 28A and/or 28B should be passivated to minimize formation of an insulative surface contamination layer. In that case, the process continues to step 408, which first cleans the contacts 28A and 28B (e.g., removing any oxidization that occurred to that point), and then forms a conductive oxide on the platinum-series element. For example, the process may form ruthenium dioxide on a ruthenium metal contact 28A and/or 28B, substantially entirely covering its entire area. In some embodiments, however, the entire area of the ruthenium metal contact 28A and/or 28B is not covered (only a portion of it is covered).

Among other ways, the ruthenium contacts 28A and/or 28B may be exposed to a thermal oxidizing environment at an elevated temperature (e.g., 200 degrees C. or greater). Alternatively, ruthenium dioxide may be directly sputtered on a surface using DC magnetron sputtering. Typical sputtering conditions, for example, may be at temperatures of 300° C., 12 mTorr pressure, with an argon/oxygen mix at 14/45 sccm. This should form a uniform a ruthenium dioxide layer that could be patterned as required by the device application. Etching materials may include $O_2/CF_4$, $O_2Cl_2$, or $O_2/N_2$ plasmas. Exposure of ruthenium metal to an oxygen plasma also should result in the selective formation of a conductive ruthenium dioxide passivation layer over the existing patterned ruthenium based metal.

Step 408 may be entirely skipped, however, if step 406 determines that passivation is not necessary. In either case, the process continues to optional step 410, which applies gettering material to the package or the die. For example, as noted above, this gettering material may control free oxygen (among other things), which, in some instances, can form a native, insulating oxide if exposed to the contacts 28A and/or 28B. As noted above, the impact of oxygen on the contacts 28A and 28B should be substantially mitigated if an area within the chamber 36 having a platinum-series "gettering" metal that is significantly greater than the area of the contacts 28A and 28B. In some embodiments, the gettering metal is the same as the metal used on the contacts 28A and/or 28B. Other embodiments, however, use different metals.

The process then concludes at step 412 by hermetically sealing the switch 16 in ambient oxygen levels that are sufficiently low so as not to saturate the gettering system 38 formed by step 410. One of ordinary skill in the art can determine those levels based on a number of factors.

As noted above, steps 410 is optional. If step 410 is skipped, that leaves step 408 (formation of conductive oxide on platinum series element) adjacent to step 412 (hermitically seal switch). As also noted above, some steps may be performed in a different order than is presented in FIG. 4. However, reversing steps 410 and 412 would mean forming conductive oxide on platinum series element within the capped switch after hermetically sealing the switch, as discussed more fully below. If that is impracticable, then combining the two steps may be an option.

An exemplary embodiment involves the passivation of a platinum-series metal contact on a substrate (or "base"), while hermetically sealing the contact within a cap that is secured to the substrate by a process that uses oxygen. Exemplary embodiments may have a platinum-series metal contact on a movable beam, or on both a substrate and a beam. For example, the contact may be ruthenium, which is passivated by the formation of ruthenium dioxide, and the hermetic seal may be formed by the use of a glass frit.

The passivation of the ruthenium contact may involve oxygen in a thermal oxidation process. Preferably, the ruthenium oxide formed will be substantially pure ruthenium dioxide. Creating other forms of oxidized ruthenium may detract from desirable properties for a contact. For example, formation of other ruthenium oxides (such as RuO and RuO4) is preferably avoided or minimized, at least because they may not be sufficiently conductive, may not be stable at normal operating temperatures, or may not be sufficiently hard for normal use.

Securing a cap to a substrate by use of a glass frit (such as lead borosilicate glass) also involves oxygen, as is known in the industry. A glass frit may comprise glass beads or particles in a paste containing solvents, usually organic. The glass beads or particles may include lead (Pb). In some embodiments, the solvent burns off at elevated temperatures, allowing the glass particles to fuse into an amorphous material. During the fusing, lead may migrate to the surface of the glass and be oxidized if sufficient oxygen is available, as discussed below.

A glass frit may be cured by a process of organic burn off ("OBO") in an oxygen environment at a temperature in the range of 200 degrees Celsius to 300 degrees Celsius, for example. The frit paste will sinter at temperatures of about 440 degrees Celsius, and in the process may release some of the lead. For example, as the temperature increases and the glass liquefies, some of the lead may come out of solution and migrate to the surface of the glass where it can interact with the ambient environment.

Free lead particles potentially pose a problem, for example if they could form conductive paths (e.g., short circuits) between conductors in the product. As such, sintering the frit paste in an oxygen environment may be useful if it oxidizes the lead, so that the lead particles are not electrically conductive.

Figure 5:
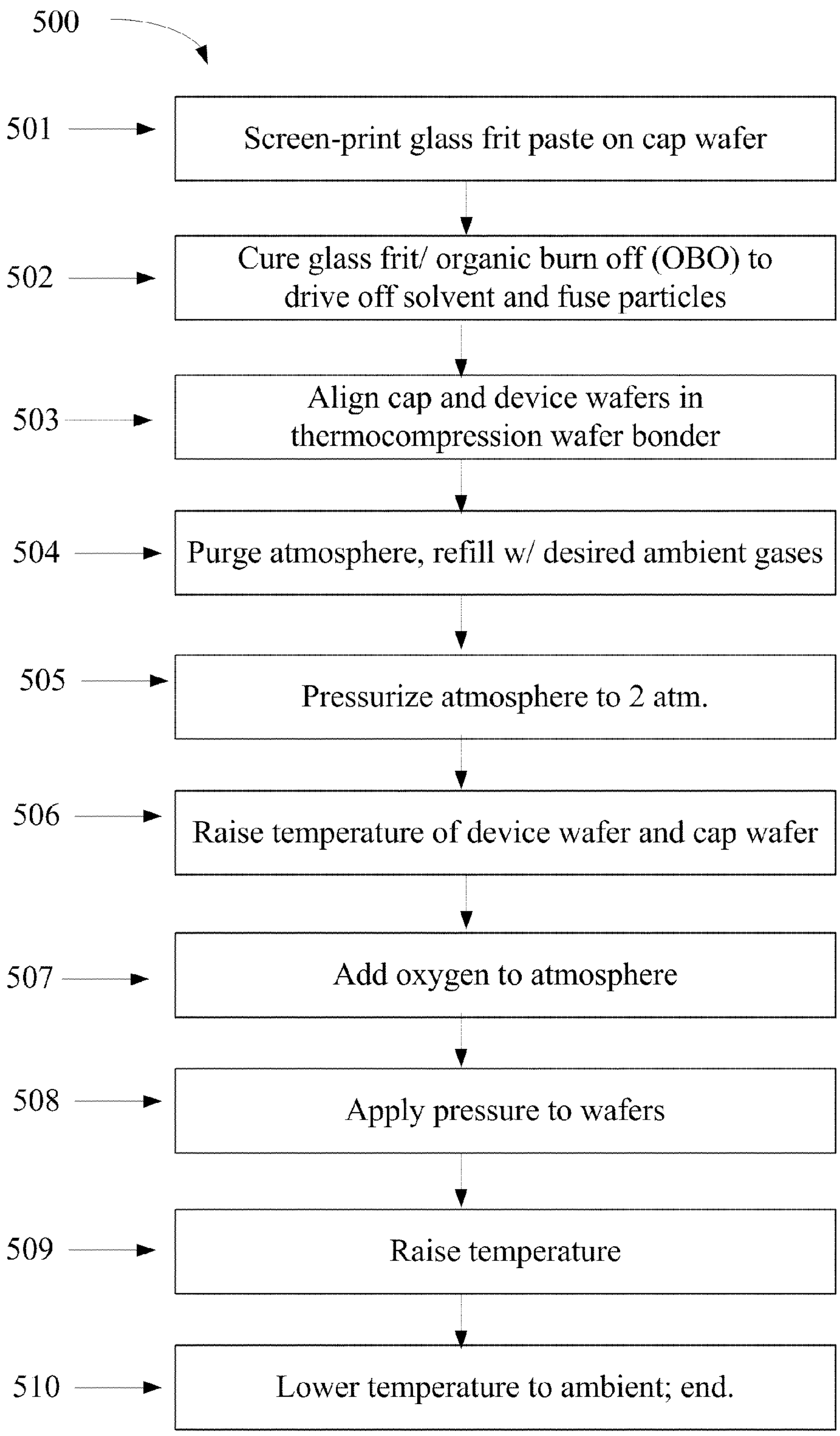
FIG. 5 is a flow chart illustrating an exemplary passivation and hermetic sealing process.

A detailed exemplary embodiment is illustrated in the flowchart 500 of FIG. 5. Lead borosilicate glass is screen-printed onto a cap wafer at 501.

Alternatively, the glass frit may be applied to the device wafer to be capped. For example, the glass frit may be applied to the device wafer to be capped if there is nothing on the surface of the device wafer that would interfere with screen printing the glass frit, such as if MEMS devices on the device wafer are fabricated in a cavity or otherwise below the surface of the device wafer to which the glass frit is being applied.

The glass frit is then cured 502 in an oxygen environment at a temperature of approximately 200 degrees Celsius to 300 degrees Celsius, to burn off (organic burn off, or "OBO") solvent. In this process, lead from the glass frit is oxidized to become non-conductive lead dioxide (PbO2).

Figure 6:
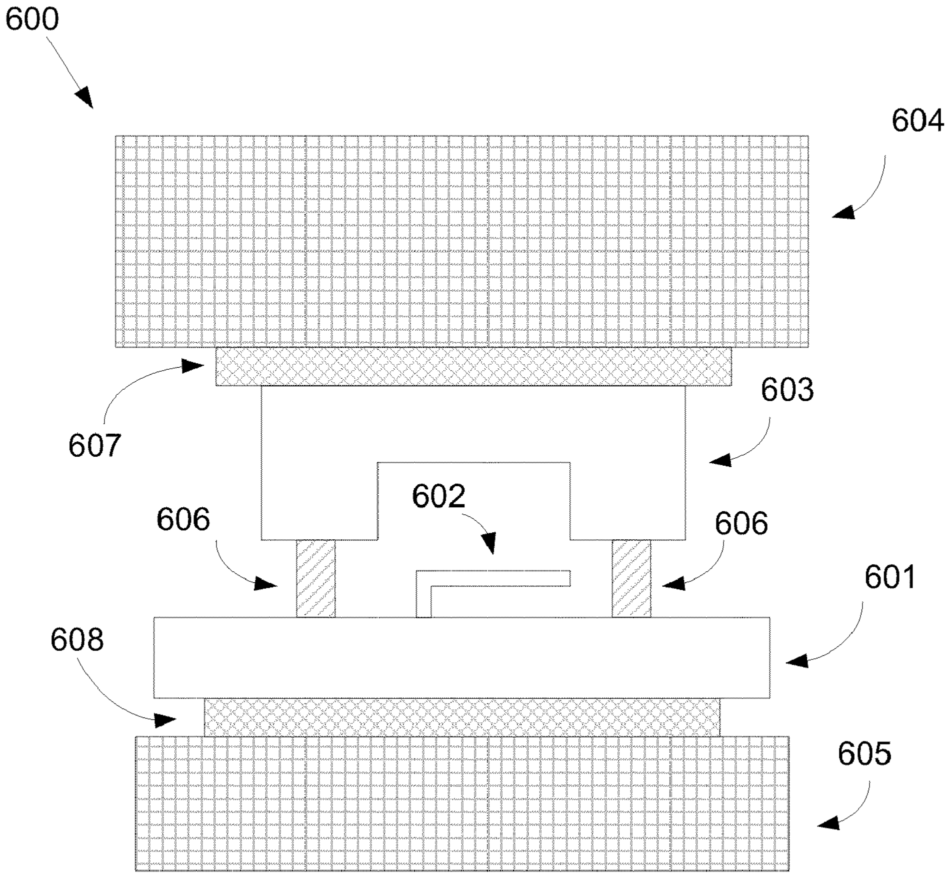
FIG. 6 schematically illustrates a thermocompression wafer bonder.

The cap and device wafer are aligned in a thermocompression wafer bonder at 503. An exemplary thermocompression wafer bonder 600 is schematically illustrated in FIG. 6. The device wafer 601, including a cantilevered MEMS beam 602, and cap wafer 603 are disposed between two chucks 604 and 605. The beam 602 may be a switch as illustrated in FIG. 2A or 3A, for example, or may include a platinum-series contact on the beam, or on a substrate opposing the beam, or both, for example. A cap 603 covers each beam 602. The chucks 604, 605 are adapted to apply compression and heat to the wafers. Between the wafers 601 and 602 is a glass frit 606. In some embodiments, graphite plates 607 and 608 may be placed between the respective chucks and wafers (chuck 604 and cap wafer 603, and chuck 605 and device wafer 601). The graphite plates may add a thermal resistance to moderate the transfer of heat from the chucks to the wafers, to reduce the effective time that the MEMS beam is exposed to high temperatures, while still providing heat sufficient produce a hermetic seal with the glass frit.

The atmosphere surrounding the wafers is purged at 504, and then filled with an ambient gas, such as dry nitrogen. The wafers and chuck assembly may be held within a chamber (not shown). The ambient fill gas may include oxygen, but including oxygen at this stage may risk formation of undesirable ruthenium oxides (i.e., RuO and RuO4). Preferably, the introduction of oxygen into the environment is delayed until the temperature of the wafers is at or above about 200 degrees Celsius.

Figure 7A:
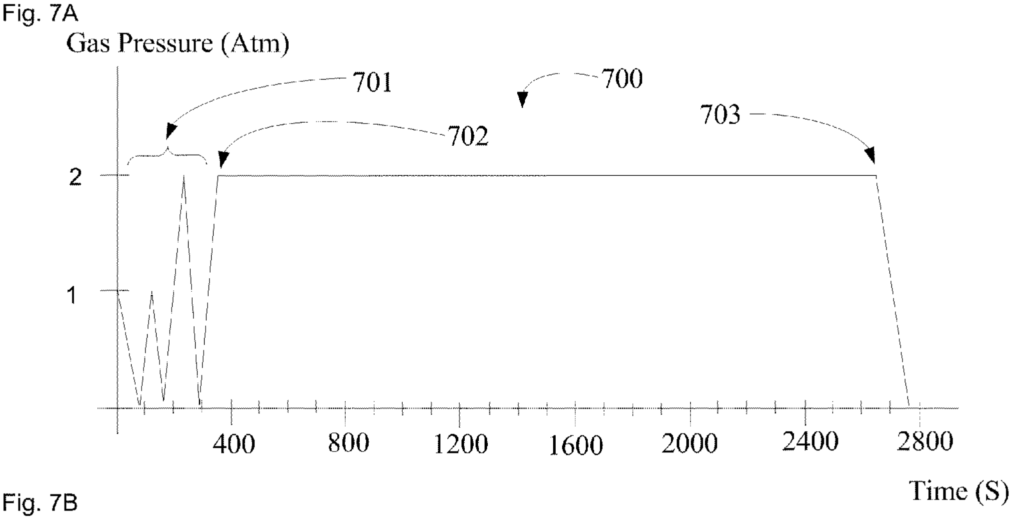
FIGS. 7A, 7B, 7C and 7D are graphs illustrating exemplary atmospheric pressure, temperature and chuck pressure profiles of exemplary embodiments.

One or more purging cycles may be applied, as illustrated (701) in FIG. 7A. For example, the chamber may be evacuated, and then refilled with an inert gas, such as dry nitrogen, before being evacuated again. Each such cycle dilutes any gas remaining from the initial ambient environment, and reduces the amount of such remaining gas with each successive evacuation.

The atmosphere is pressurized to 2 atmospheres at 505, and the temperature of the wafers is increased to greater that about 200 degrees Celsius at 506. As discussed above, preferably the environment of the chamber is substantially free of oxygen while the temperature is below 200 degrees Celsius, so ideally no unstable or non-conductive ruthenium oxides are formed.

When the temperature is above about 200 degrees Celsius, oxygen may be introduced into the chamber at 507. This may not be necessary if oxygen was introduced into the chamber at a previous point (such as 504). The amount of oxygen in the environment is preferably sufficient to oxidize the ruthenium contacts to form ruthenium dioxide, and to complete OBO, burning off any remaining solvents in the glass paste, and to oxidize any metallic lead that precipitates to the surface of the glass when the glass fuses. The environment need not be pure oxygen, but a partial pressure of oxygen facilitates the oxidation of any metallic lead precipitates so that they are not electrically conductive, and the completion of the organic burn-off of any remaining solvents in the glass frit system.

In this environment, ruthenium dioxide will begin to form on the ruthenium contact. The process of forming ruthenium dioxide on the contact is self-limiting, because ruthenium dioxide forms where ruthenium is exposed to oxygen. As ruthenium dioxide forms at the exposed surface of the ruthenium contact, that ruthenium dioxide begins to shield the underlying ruthenium. Formation of additional ruthenium dioxide occurs within the ruthenium contact at the interface of the ruthenium and the previously formed ruthenium dioxide. As such, oxygen from the environment must diffuse through any previously formed ruthenium dioxide to reach that interface. Eventually, the ruthenium dioxide grows thick enough to prevent oxygen from migrating through the ruthenium dioxide to reach the underlying ruthenium. At that point, formation of additional ruthenium dioxide is substantially prevented. Any remaining oxygen in the environment will have no further effect on the contact, and as such may be effectively harmless. In preferred embodiments, the ruthenium oxides formed on the contact are substantially free of oxides other than RuO2, but some amounts of other ruthenium oxides may be acceptable. Preferably, the ruthenium oxides comprise at least fifty percent ruthenium dioxide.

Pressure is applied to the wafers via the chucks at 508. The temperature of the chuck, and thus the wafers, is raised to about 440 degrees Celsius at 509.

The combination of temperature, pressure, and the oxygenated environment will cause the glass frit to sinter over time, bonding the wafers. The temperature of the wafers is lowered to ambient at 510.

FIGS. 7A, 7B, 7C and 7D are graphs (700, 720, 740, 750) illustrating exemplary pressure, temperature and purging profiles of an exemplary embodiment of the process performed on wafers in a chamber with a controllable environment. The wafers comprise a plurality of die and caps, for example as illustrated in FIG. 6. The time scales of these graphs are synchronized with each other. The time axes in FIGS. 7A, 7B, 7C and 7D is expressed in seconds, as measured from the beginning of the process.

In FIG. 7A, several purge cycles 701 between about zero and 300 seconds repeatedly evacuate the atmosphere of the chamber and fill it with an ambient gas. Then the chamber is filled with an ambient gas to a pressure of approximately 2 atmospheres at about 350 seconds 702.

Figure 7B:
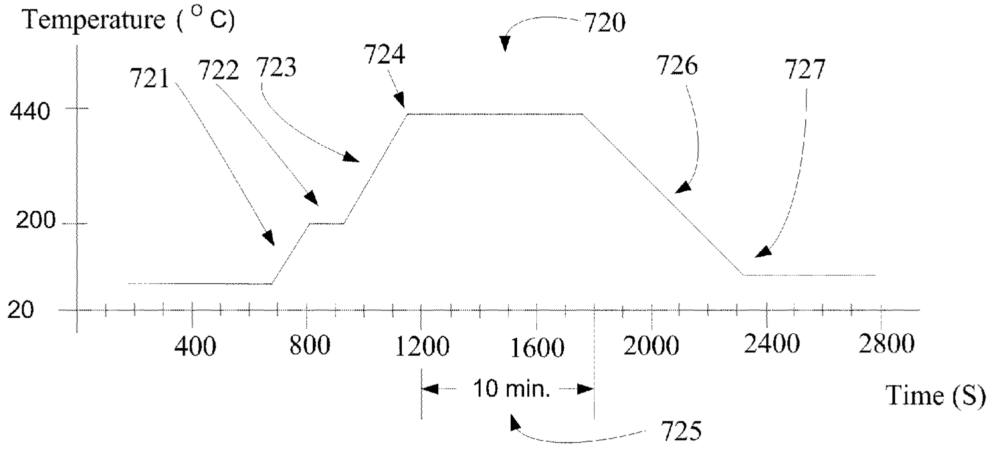

As illustrated in FIG. 7B, the temperature of the wafers is raised 721 to about 200 degrees Celsius after the purging is complete and the chamber is filled with ambient gas. Preferably, the temperature is raised rapidly enough that formation of oxides other than ruthenium dioxide (RuO2) are minimized. In some embodiments, the temperature is raised at about 100 degrees Celsius per minute, although rates from about 50 degrees Celsius per minute to about 200 degrees Celsius per minute may still be considered rapid in some embodiments.

Oxygen may be added after the temperature reaches about 200 degrees Celsius. At this temperature, the ruthenium contact is passivated by the formation of ruthenium dioxide as the wafers soak in the elevated temperature environment for about two minutes 722. Such a soak may include a period where the temperature is held steady 722, but may also occur during an uninterrupted rise in temperature (see FIG. 7D). ruthenium In some embodiments, the wafers may be maintained at a temperature (which may be known as an "idle" temperature) of above 200 degrees Celsius, as opposed for example to lowering the temperature to below 200 degrees Celsius prior to beginning the passivation and capping process. In the illustrative example of FIG. 7D, the temperature of the wafers is maintained at 250 degrees Celsius 728, even before purge cycles 701 begin. As such, some ruthenium oxides (such as RuO2) may begin to form as soon as wafers are introduced into the chamber. Also as illustrated in FIG. 7D, some embodiments raise the temperature at an uninterrupted or steady rate 723, without providing a soak period 722 as illustrated in FIG. 7B. Such a rise in temperature may be used irrespective of whether the rise begins above or below 200 degrees Celsius.

Then in FIG. 7B, the temperature is raised 723 to approximately 440 degrees Celsius 724, beginning at about 900 seconds and continuing to about 1150 seconds. In some embodiments, the temperature 724 may be 425 degrees Celsius.

Figure 7C:
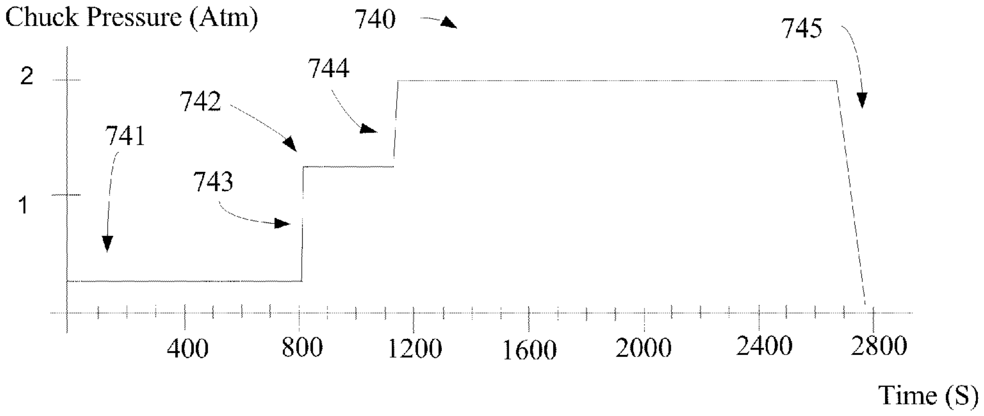
Figure 7D:
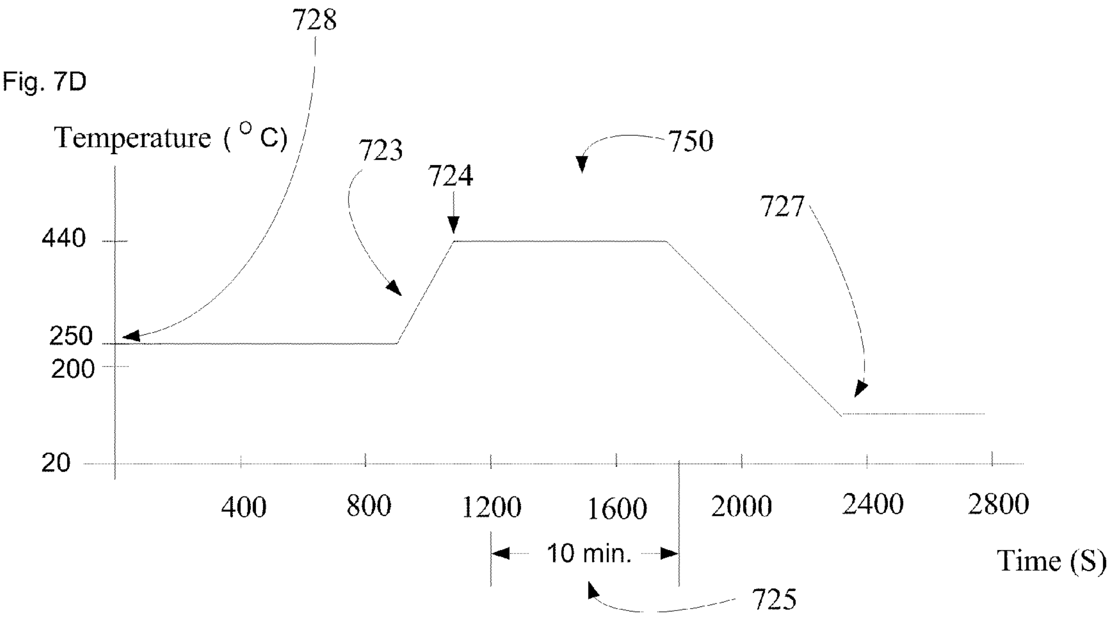

In FIG. 7C, the chuck pressure exerted on the cap and device wafers is held low during the purging process 741, but is raised 743 to about one (1) atmosphere at about 800 seconds 742, which is about when the temperature reaches approximately 200 degrees Celsius (see FIG. 7B). When the temperature reaches about 440 degrees Celsius (see FIG. 7B), the pressure is raised 744 to about two (2) atmospheres.

The wafers are held under this pressure and temperature for approximately ten minutes 725, during which time the bonding occurs. Some embodiments hold the wafers under this pressure for five minutes. Preferably, the cap is hermetically sealed to the substrate by the bonding process. Thereafter, the temperature is ramped down 726 to about or below 200 degrees Celsius, between about 1800 seconds and 2300 seconds. After the temperature has reached about or below 200 degrees Celsius 727, the gas pressure 703 and chuck pressure 745 are reduced.

The bonded wafers may then be removed from the chamber for further processing, such as die singulation, test, and packaging.

The amount of oxygen, gas pressure, chuck pressure, temperatures, and times will vary depending on each other, and the devices being fabricated. For example, the oxygen concentrations will be determined, at least in part, by the amount or area of ruthenium surfaces, exposed glass frit area, temperature, and dwell time at temperature. Oxygen concentrations from 0.25 percent to 10 percent have been successfully used. Clean dry air ("CDA"; approximately twenty percent oxygen) has also been successfully used.

Also, the pressure of the gas within the chamber may vary as a function of the temperature at which the pressure is measured. Preferably, the pressure at any given temperature is such that, when the temperature of the gas is brought to room temperature (e.g., 25 degrees Celsius), the pressure of the gas is reduced to about 1 atmosphere. A higher pressure may be used if the pressure within the hermetically sealed devices is desired to be higher than 1 atmosphere when the device is at room temperature. Such a pressure may assist in keeping elements from the external environment from seeping into the device. Alternately, lower pressure may be used if the pressure within the hermetically sealed device is desired to be lower than 1 atmosphere when the device is at room temperature. Such a pressure may be useful, for example, for (1) partial vacuum packaging to reduce mechanical damping of the MEMS structures or (2) limiting the volume of gases available to react with a capped MEMS device over its lifetime, or (3) facilitating hemeticity testing (for example, a leaking device would draw in ambient atmosphere and perhaps degrade in performance so that it would fail subsequent mechanical or electrical screening).

Figure 8A:
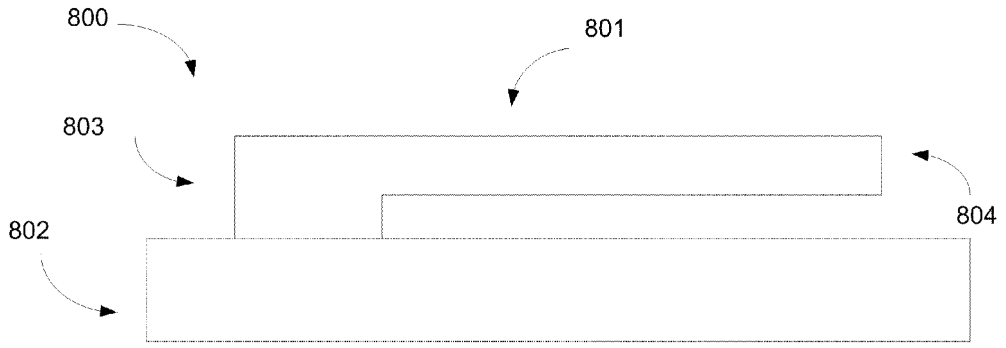
FIGS. 8A, 8B and 8C schematically illustrate deformation of a MEMS beam on a substrate.
Figure 8B:
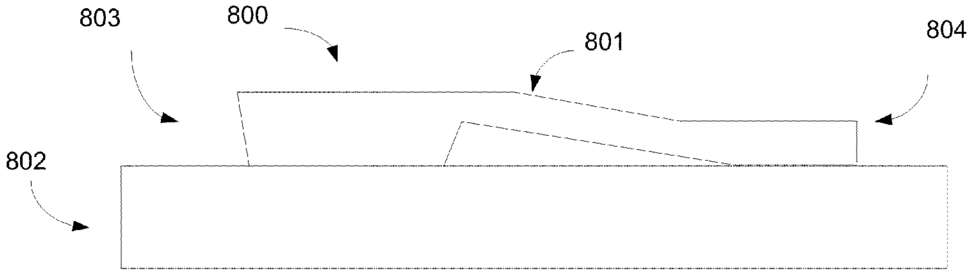
Figure 8C:
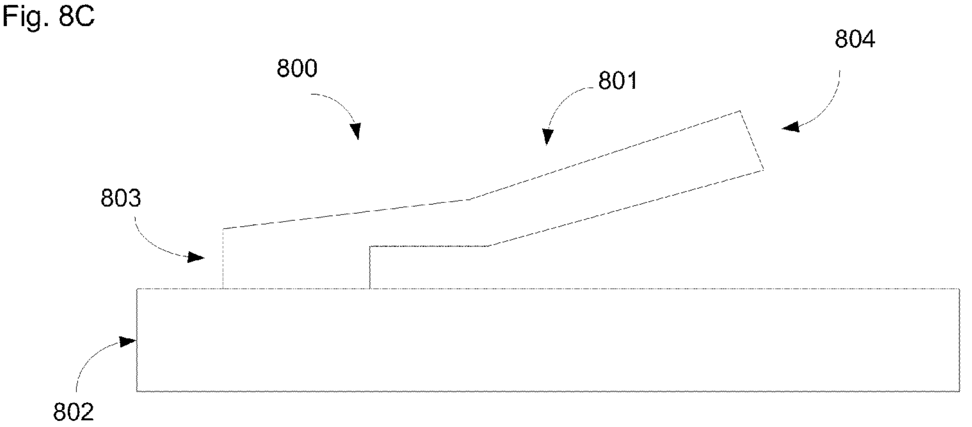

In some embodiments that involve the formation of a MEMS beam or cantilever, it may be desirable to limit the time that the MEMS structure is exposed to high temperatures, such as the 440 degree Celsius temperature described above. For example, a MEMS structure 800, including a cantilevered beam 801, is schematically illustrated in FIG. 8A. The beam 801 is suspended from the substrate 802 by foundation 803. As the temperature of the structure is raised, the structure 800 naturally tends to expand. However, the expansion of the portion of the foundation 803 near the substrate 802 may be somewhat restricted if the substrate 802 expands less than the foundation 803. This will cause a downward force on the cantilever beam 801, which may cause the beam 801 to lower towards the substrate 802. Eventually, the tip 804 of the cantilever beam 801 may contact the substrate 802, and the tip 804 will not be able to move further. Additional downward force on the beam 801 may cause the beam 801 to warp or bend along its length, between the tip 804 and the foundation 803, as illustrated in FIG. 8B. Such a bend may be a plastic deformation, such that the beam 801 will incur a curvature that will not be relieved even when the downward force is removed, as illustrated in FIG. 8C. Such a curvature is undesirable, and may impede the use of the beam for its intended purpose, or may even render the beam unsuitable for its intended purpose. For example, if the cantilever beam is the movable arm of a switch, such a curvature may cause the switch to require additional force to close the switch.

In some illustrative embodiments, the oxygen may be supplied as a plasma. The formation of ruthenium dioxide is an endothermic process, so some energy is supplied, for example, from the elevated chamber or wafer temperature, or from the energy in a plasma. Too little energy may result in the formation of undesirable ruthenium oxides (e.g., RuO or RuO4).

Some embodiments may use anodic bonding, rather than a frit. Anodic bonding does not require oxygen, but could be performed in an oxygen environment to, for example, passivate a contact while bonding or provide an environment suitable to passivate the contact during a thermal cycle subsequent to bonding. Alternate bonding methods may occur without the use of a thermocompression bonder, as illustrated for some embodiments herein.

In an illustrative embodiment, a switch may be hermetically capped using a low temperature process in an oxygen-rich atmosphere. The temperature would preferably be lower than the temperature that would form an undesirable oxide (such as RuO or RuO4), and in any case lower than that required to form a conductive oxide (such as ruthenium dioxide, for example). The device could then be heated to at an elevated temperature, while sealed, allowing oxygen confined within the volume of the cap to form the conductive oxide, such as ruthenium dioxide. Such a hermetic seal may be formed at sufficiently low temperature by anodic bonding or low-temperature metal eutectic bonding, for example.

Figure 9:
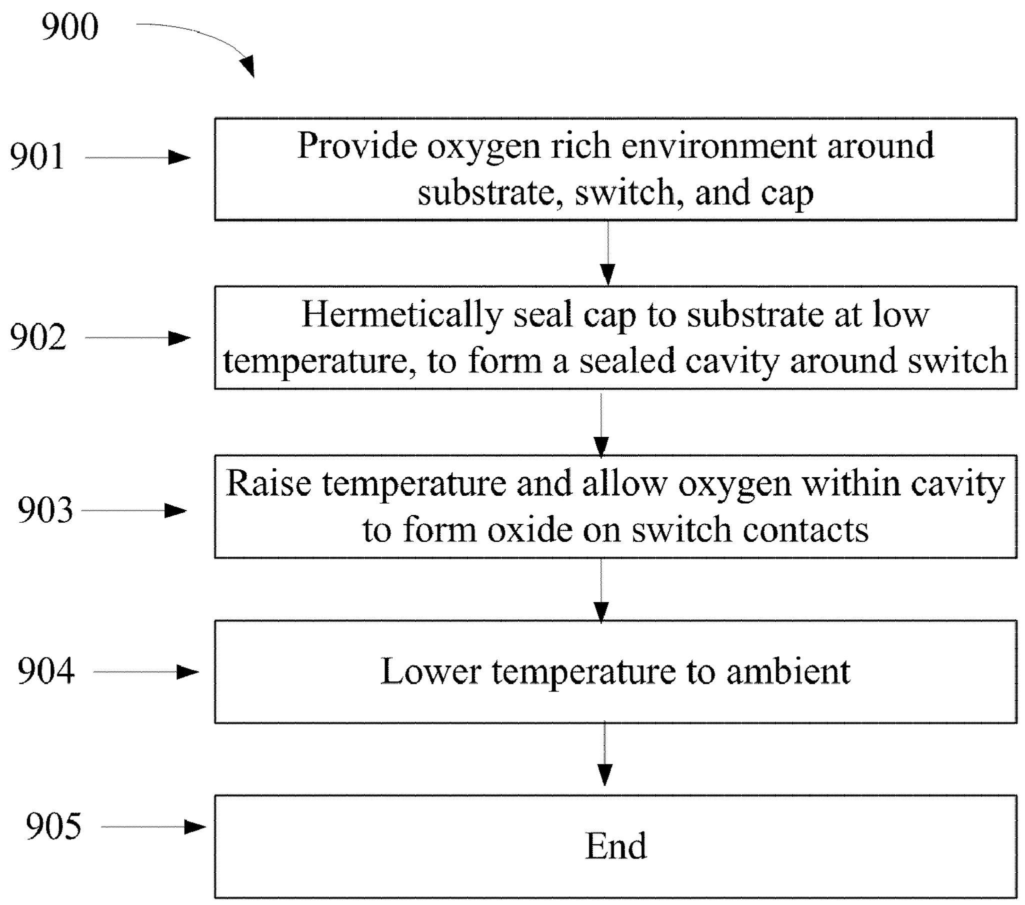
FIG. 9 is a flow chart illustrating an exemplary passivation and hermetic sealing process.

A flow chart illustrating such a process 900 is presented in FIG. 9. In an illustrative embodiment, a substrate bearing a switch with contacts, and a cap, are provided in an oxygen-rich environment 901. The environment should contain sufficient oxygen to allow the formation of an oxide on the switch contacts, and also to supply oxygen to any other part of the capping process that may use oxygen. The temperature should be below the point where the contacts will substantially oxidize in the short time it will take to hermetically seal the cap to the substrate.

The cap is then hermetically sealed to the substrate 902, so as to cover the switch and the contacts within a cavity formed by the cap and substrate. Because this is occurring in the oxygen-rich environment, there will be some oxygen contained within the cavity.

Next, the temperature within the cavity is raised 903 to a point where the contacts will oxidize with the oxygen within the cavity. Preferably the temperature is raised quickly to a point where the desired oxide is formed, and the formation of undesired oxides is mitigated. For example, if the contact is made of ruthenium, and ruthenium dioxide is formed, the temperature should be raised quickly to about 200 degrees Celsius, for example at a rate of about 100 degrees Celsius per minute. The temperature should be made to pass quickly through temperature ranges in which other oxides (such as RuO or RuO4) would form.

After the contacts are oxidized, the temperature is lowered 904 and the process ends 905.

The exemplary processes described above may be useful for other packaging systems, such as the cavity package 38 in FIG. 2B, for example, or a CERDIP (e.g., "CERamic Dual In-line Package") packages that use a glass-sealed, ceramic construction. A CERDIP package may have a ceramic lid (or cap) hermetically sealed to a base (or substrate) using a frit.

In general, the processes may be useful for capping or sealing an apparatus that includes surfaces that would benefit from passivation, such as surfaces that may undesirably have a capacity to stick to one another. Embodiments may reduce or eliminate the need for a getter in the package. Also, the process steps described herein are exemplary only. In varying applications, some process steps may be skipped or combined, or their order rearranged.

Accordingly, illustrative embodiments of the invention benefit from the material properties of platinum-series based materials while mitigating the contamination problems that prevented known prior art devices from using such materials. Moreover, various embodiments further protect against possible contamination with a gettering system 38 within the package chamber 36. Among other benefits, these optimizations should improve switch performance and increase switch lifetime.

Although the above discussion discloses various exemplary embodiments of the invention, it should be apparent that those skilled in the art can make various modifications that will achieve some of the advantages of the invention without departing from the true scope of the invention. For example, in some embodiments, only one contact 28A or 28B is formed as discussed above, while the other contact 28B or 28A is formed by conventional means, such as with gold or a gold alloy. In other embodiments, an apparatus may have a plurality of contacts that operate in parallel. Therefore, the embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method for forming a capped MEMS switch apparatus, the method comprising:

providing a base with a platinum-series contact;

covering the contact with a cap;

disposing a frit between the cap and the base;

providing an atmosphere comprising oxygen around the base, cap and frit;

applying a first pressure to the base and cap, so as to press the base, cap and frit together;

setting the temperature of the base and cap at a first temperature above about 200 degrees Celsius, to oxidize the contact; and increasing the pressure applied to the base and cap to a second pressure and raising the temperature of the base and cap to a second temperature, to hermetically seal the cap to the base with the frit.

2. A method for forming a capped semiconductor apparatus according to claim 1 wherein the atmosphere is substantially free of oxygen until the temperature of the base and cap is at or above 200 degrees Celsius.

3. A method for forming a capped semiconductor apparatus according to claim 1, wherein providing an atmosphere comprising oxygen comprises introducing oxygen to the atmosphere after the temperature of the base and cap is at or above about 200 degrees Celsius.

4. A method for forming a capped semiconductor apparatus according to claim 1, wherein the second temperature is at or above about 425 degrees Celsius.

5. A method for forming a capped semiconductor apparatus according to claim 1 wherein setting the temperature of the base and cap at a first temperature further comprises maintaining the temperature between 200 degrees Celsius and 300 degrees Celsius for 120 seconds.

6. A method for forming a capped semiconductor apparatus according to claim 1, wherein increasing the pressure begins about the time that the second temperature reaches 425 degrees Celsius.

7. A method for forming a capped semiconductor apparatus according to claim 1, wherein applying pressure to the base and cap comprises applying pressure to the base via a base chuck, and to the cap via a cap chuck, and further comprises providing a first thermal resistance between the base and the base chuck, and a second thermal resistance between the cap and the cap chuck.

8. A method for forming a capped semiconductor apparatus according to claim 7, wherein first and second thermal resistances comprise graphite plates.

9. A method for forming a capped semiconductor apparatus according to claim 1 wherein the base is a base of a cavity package, and the cap is a lid of a cavity package.

10. A method for forming a capped semiconductor apparatus according to claim 9 wherein the cavity package is a ceramic package.

11. A method for forming a capped semiconductor apparatus according to claim 1, wherein the platinum-series contact comprises ruthenium.

12. A method for forming a capped semiconductor apparatus according to claim 11, wherein:

the first pressure is about one atmosphere;

the second pressure is about two atmospheres;

the second temperature is about 425 degrees Celsius; and wherein the base and cap are held at the second pressure and second temperature for 300 seconds.

* * * * *